United States Patent
Wakaoka et al.

(10) Patent No.: US 10,544,994 B2
(45) Date of Patent: Jan. 28, 2020

(54) SHEET-SHAPED HEAT PIPE

(71) Applicant: Murata Manufacturing Co., Ltd., Nagaokakyo-shi, Kyoto-fu (JP)

(72) Inventors: Takuo Wakaoka, Nagaokakyo (JP); Atsushi Kishimoto, Nagaokakyo (JP); Tadamasa Miura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 34 days.

(21) Appl. No.: 15/712,175

(22) Filed: Sep. 22, 2017

(65) Prior Publication Data

US 2018/0010861 A1 Jan. 11, 2018

Related U.S. Application Data

(63) Continuation of application No. PCT/JP2015/080027, filed on Oct. 23, 2015.
(Continued)

(30) Foreign Application Priority Data

Mar. 26, 2015 (JP) .................. 2015-064666

(51) Int. Cl.
*F28D 15/02* (2006.01)
*F28D 15/04* (2006.01)
(Continued)

(52) U.S. Cl.
CPC ....... *F28D 15/0233* (2013.01); *F28D 15/046* (2013.01); *F28F 21/081* (2013.01);
(Continued)

(58) Field of Classification Search
CPC ...... F28D 15/02; F28D 15/0233; F28D 15/04; F28D 15/046; F28D 2020/0013;
(Continued)

(56) References Cited

U.S. PATENT DOCUMENTS 5,083,607 A * 1/1992 Lebrun .................. F25B 17/08
165/104.12
6,269,866 B1 * 8/2001 Yamamoto .......... F28D 15/0233
165/104.26
(Continued)

FOREIGN PATENT DOCUMENTS

CN 102215658 A 10/2011
CN 202182665 U 4/2012
(Continued)

OTHER PUBLICATIONS

English translation Central Glass Co. (JP2011-021211) Feb. 3, 2011.*
(Continued)

*Primary Examiner* — Joel M Attey
(74) *Attorney, Agent, or Firm* — Keating and Bennett, LLP (57) ABSTRACT

A sheet-shaped heat pipe includes a sheet-shaped container, a wick sealed in the container, and a working fluid sealed in the container, the sheet-shaped container including a first metal sheet and a second metal sheet, the first metal sheet and the second metal sheet being superposed in direct contact with each other at a peripheral edge portion, and the sheet-shaped container having a thickness of about 0.5 mm or less, and a thin heat dissipating plate that includes the sheet-shaped heat pipe.

26 Claims, 6 Drawing Sheets

Related U.S. Application Data (60) Provisional application No. 62/234,757, filed on Sep. 30, 2015.

(51) Int. Cl.
*F28F 21/08* (2006.01)
*H01L 23/427* (2006.01)
*F28D 21/00* (2006.01)
*F28D 20/00* (2006.01)

(52) U.S. Cl.
CPC ............ *H01L 23/427* (2013.01); *F28D 15/02* (2013.01); *F28D 15/04* (2013.01); *F28D 2020/0013* (2013.01); *F28D 2021/0028* (2013.01); *F28F 2255/06* (2013.01)

(58) Field of Classification Search
CPC ............ F28D 2021/0028; F28F 21/081; F28F 2255/06; H01L 23/427
USPC .............................. 165/80.2, 104.26, 104.33
See application file for complete search history.

(56) References Cited

U.S. PATENT DOCUMENTS

| | | | |
|---|---|---|---|
| 7,007,741 B2 * | 3/2006 | Sen | H01L 23/433 165/185 |
| 2003/0081382 A1 * | 5/2003 | Lin | H01L 23/427 361/697 |
| 2004/0069462 A1 | 4/2004 | Hashimoto | |
| 2006/0016580 A1 | 1/2006 | Lee et al. | |
| 2007/0068657 A1 * | 3/2007 | Yamamoto | F28D 15/0233 165/104.26 |
| 2009/0217691 A1 * | 9/2009 | Schmidt | F25B 35/04 62/271 |
| 2010/0294475 A1 | 11/2010 | Rush et al. | |
| 2011/0146956 A1 | 6/2011 | Stroock et al. | |
| 2011/0198059 A1 | 8/2011 | Gavillet et al. | |
| 2015/0077929 A1 | 3/2015 | Honmura et al. | |
| 2016/0282914 A1 * | 9/2016 | Saito | H05K 7/20336 |

FOREIGN PATENT DOCUMENTS

| | | |
|---|---|---|
| CN | 202364516 U | 8/2012 |
| CN | 104053335 A | 9/2014 |
| CN | 104089509 A | 10/2014 |
| JP | 52-118661 A | 10/1977 |
| JP | 06-291480 A | 10/1994 |
| JP | 2000-241095 A | 9/2000 |
| JP | 2004-012011 A | 1/2004 |
| JP | 2004-022603 A | 1/2004 |
| JP | 2004-116871 A | 4/2004 |
| JP | 2007-003164 A | 1/2007 |
| JP | 2007-017115 A | 1/2007 |
| JP | 2007-093032 A | 4/2007 |
| JP | 2011-003604 A | 1/2011 |
| JP | 2011-021211 A | 2/2011 |
| JP | 2011-080679 A | 4/2011 |
| JP | 2011-530195 A | 12/2011 |
| JP | 2012-255577 A | 12/2012 |
| JP | 2013-012508 A | 1/2013 |
| JP | 2015-095629 A | 5/2015 |
| WO | 2009/049397 A1 | 4/2009 |

OTHER PUBLICATIONS

English translation Gyokusei Kako Yugen Koshi (JP2007-017115) Jan. 25, 2007.*
English translation NTT electronics corp. (JP2013-012508) Jan. 17, 2013.*
Website engineeringtoolbox.com/thermal-conductivity-metals-d_858.html Accessed Apr. 25, 2019.*
Website ctherm.com/resources/blog/the_thermal_conductivity_of_unfilled_plastics/ Accessed Apr. 25, 2019.*
Website amesweb.info/Materials/Modulus-of-Elasticity-Metals.aspx Accessed Apr. 25, 2019.*
Website makeitfrom.com/compare/Acrylonitrile-Butadiene-Styrene-ABS/Epoxy Accessed Apr. 25, 2019.*
Official Communication issued in corresponding Japanese Patent Application No. 2017-507319, dated Jul. 3, 2018.
Official Communication issued in corresponding Japanese Patent Application No. 2017-508466, dated Jul. 3, 2018.
Official Communication issued in corresponding Chinese Patent Application No. 201580076896.4, dated Oct. 19, 2018.
Official Communication issued in corresponding Japanese Patent Application No. 2017-507319, dated Jan. 29, 2019.
Ryotaro Matsuda, et al., "Novel Crystalline Porous Compounds Based on Metal Complexes—Structures and Functions", Journal of the Crystallographic Society of Japan, 2004, vol. 46, No. 1., 6 pages.
Official Communication issued in International Patent Application No. PCT/JP2015/080027, dated Jan. 19, 2016.

* cited by examiner

SHEET-SHAPED HEAT PIPE

CROSS REFERENCE TO RELATED APPLICATIONS

This application claims the benefit of priority to Japanese Patent Application No. 2015-064666 filed on Mar. 26, 2015 and U.S. Provisional Application No. 62/234,757 filed on Sep. 30, 2015, and is a Continuation Application of PCT Application No. PCT/JP2015/080027 filed on Oct. 23, 2015. The entire contents of each application are hereby incorporated herein by reference.

BACKGROUND OF THE INVENTION

1. Field of the Invention

The present invention relates to a sheet-shaped heat pipe and a thin heat dissipating plate using the sheet-shaped heat pipe.

2. Description of the Related Art

In recent years, the amount of heat generation has been increased along with high integration and high performance of elements. Also, since the heating density has been increased by miniaturization of products, it has been important to take measures to dissipate heat. This circumstance is more pronounced in mobile terminals, such as smartphones and tablets, and thermal design is significantly difficult. Recently, for example, a graphite sheet has often been used as a heat countermeasure member, but the heat transport amount thereof is insufficient.

On the other hand, a heat pipe (or a vapor chamber) is an example of a heat countermeasure member having a high heat transport ability. The total apparent thermal conductivity of the heat pipe is about several times to several tens of times higher than that of metal, such as copper or aluminum.

For example, as a heat countermeasure member using a heat pipe, Japanese Unexamined Patent Application Publication No. 2011-003604 proposes a heat dissipating plate incorporating a heat pipe. In this heat dissipating plate, a groove is provided in a plate of a body portion of a heat dissipating unit or a heat conducting member to be provide on the body portion from above, and a heat pipe is set in the groove. The plate, the heat pipe, and the heat conducting member are bonded with a bonding material such as solder.

Japanese Unexamined Patent Application Publication No. 2015-095629 proposes a high-heat-dissipating thin cooling structure using a heat pipe for a mobile electronic device. In this cooling structure, a heat pipe that is flattened by being compressed in the thickness direction is set on a heat dissipating plate, and one end of the heat pipe is disposed at a position to receive heat from a heating component. The heating component is covered with a shield plate. The plate has a stepped portion that is bent toward a substrate to be thinner than the heating component at a position outside the heating component in the width direction or the length direction. One end of the flat heat pipe is held between the stepped portion and the heat dissipating plate.

In the heat dissipating plate described in Japanese Unexamined Patent Application Publication No. 2011-003604, the plate of the body portion needs to ensure a sufficient thickness to form the recess in which the heat conducting member is fitted and the groove in which the heat pipe is fitted. In information terminals, such as smartphones and tablets, which are required to be thin, it is difficult for the heat dissipating plate of Japanese Unexamined Patent Application Publication No. 2011-003604 to achieve the required thinning.

On the other hand, the heat dissipating plate including the flat heat pipe described in Japanese Unexamined Patent Application Publication No. 2015-095629 also has a thickness limitation because it is necessary to form the groove holding the heat pipe in the shield case. Further, while the heat countermeasure member of Japanese Unexamined Patent Application Publication No. 2015-095629 is required to have a function as an electromagnetic shield for noise removal and a function of increasing the mechanical strength of a housing, the functions may become insufficient if the portions are thinned to decrease the thickness of the heat countermeasure member. Further, since the flat heat pipe described in Japanese Unexamined Patent Application Publication No. 2015-095629 is flattened by forming a round pipe and then compressing the round pipe, it is difficult to easily change the wall thickness of the pipe.

SUMMARY OF THE INVENTION

Preferred embodiments of the present invention provide thin heat countermeasure members, for example, a heat pipe or a heat dissipating plate.

The present inventors discovered, as a result of intensive studies made to solve the above-described problems, that the above problems could be solved by using a sheet-shaped heat pipe in which a wick and a working fluid are sealed in a sheet-shaped container formed by bonding metal sheets.

According to a first preferred embodiment of the present invention, a sheet-shaped heat pipe includes a sheet-shaped container, a wick sealed in the container, and a working fluid sealed in the container, wherein the sheet-shaped container includes a first metal sheet and a second metal sheet, the first metal sheet and the second metal sheet are superposed and partially bonded to define a closed internal space, and a thickness of the sheet-shaped container is preferably about 0.5 mm or less, for example.

According to a second preferred embodiment of the present invention, a thin heat dissipating plate includes a metal plate, and the above-described sheet-shaped heat pipe disposed on the metal plate such that the metal plate and a principal surface of the second metal sheet are in direct contact with each other.

According to a third preferred embodiment of the present invention, a thin heat dissipating plate includes a metal plate, and a sheet-shaped heat pipe disposed on the metal plate, wherein the sheet-shaped heat pipe includes a sheet-shaped container, a wick sealed in the container, and a working fluid sealed in the container, the sheet-shaped container includes a first metal sheet and a second metal sheet, the first metal sheet and the second metal sheet are superposed and partially bonded to define a closed internal space, and the second metal sheet is combined with the metal plate or the metal plate also defines and functions as the second metal sheet.

According to a fourth preferred embodiment of the present invention, an electronic device includes a sheet-shaped heat pipe or a thin heat dissipating plate according to a preferred embodiment of the present invention.

According to various preferred embodiments of the present invention, it is possible to provide heat countermeasure members to be used in a small electronic device by using sheet-shaped heat pipes according to a preferred embodiment of the present invention in which the wick and the working fluid are sealed in the sheet-shaped container including bonded metal sheets. The sheet-shaped heat pipes of preferred embodiments of the present invention and the cooling plates including the sheet-shaped heat pipes of preferred embodiments of the present invention are able to have a high degree of design flexibility, for example, the thickness of a container wall, and are able to have various functions in addition to a cooling function.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Sheet-shaped heat pipes according to preferred embodiments of the present invention will be described below.

In this description, "heat pipe" refers to a device that includes a container and a working fluid and a wick sealed in the container and is able to transport heat from an evaporation unit to a cooling unit. Heat is transported in a cycle in which the working fluid evaporates by absorbing heat in the evaporation unit, the working fluid in a gas phase moves to the cooling unit and condenses by dissipating the heat in the cooling unit, and the working fluid in a liquid phase moves to the evaporation unit again.

In the container, a first metal sheet and a second metal sheet are superposed and bonded together at a portion, for example, at a peripheral edge portion to define a closed internal space. The first metal sheet and the second metal sheet do not always need to be completely aligned, and it is only required that the first metal sheet and the second metal sheet be superposed to such an extent to ensure a sufficient space to seal the wick and the working fluid therein.

While the materials of the first metal sheet and the second metal sheet are not particularly limited, they are, for example, preferably copper, aluminum, titanium, nickel, silver, or an alloy of these materials.

In a preferred embodiment of the present invention, the material of the first metal sheet and the material of the second metal sheet are preferably different. By making the materials of the sheets different, one function is able to be obtained by one of the metal sheets, and another function is able to be obtained by the other metal sheet.

While the above-described functions are not particularly limited, examples of the functions include a strength increasing function, a rigidity increasing function, a heat conducting function, and an electromagnetic shield function.

In a preferred embodiment of the present invention, a thermal conductivity of the material of one of the metal sheets may preferably be higher than a thermal conductivity of the material of the other metal sheet. By making the thermal conductivity of one of the metal sheets high, heat is able to be efficiently transmitted, and another function is able to be obtained by the other metal sheet.

Examples of the material having a high thermal conductivity include copper, silver, or an alloy of these materials.

In another preferred embodiment of the present invention, a hardness of the material of one of the metal sheets may preferably be higher than a hardness of the material of the other metal sheet. By making the hardness of one of the metal sheets high, the strength and rigidity is able to be secured by this metal sheet, and another function is able to be obtained by the other metal sheet.

Examples of the material having a high hardness include titanium and an aluminum alloy.

Thicknesses of the first metal sheet and the second metal sheet may preferably be within a range of about 0.018 mm to about 0.38 mm, and more preferably within a range of about 0.018 mm to about 0.18 mm, for example. The thicknesses of the first metal sheet and the second metal sheet may be either equal or different.

In a preferred embodiment of the present invention, the thicknesses of the first metal sheet and the second metal sheet are preferably different from each other. By making the thicknesses of the sheets different, one function is able to be obtained by one of the metal sheets and another function is able to be obtained by the other metal sheet. For example, a thicker metal sheet is able to have a higher electromagnetic shield function, a higher strength increasing function, and a higher rigidity increasing function. In contrast, a thinner metal sheet is able to have a function of more efficiently transmitting heat in the thickness direction.

In a preferred embodiment of the present invention, the first metal sheet and the second metal sheet may each preferably have a thick portion and a thin portion. That is, one metal sheet may include a thicker portion (thick portion) and a thinner portion (thin portion). By changing the thickness in one metal sheet, the one metal sheet is able to provide a plurality of functions.

In this preferred embodiment, the first metal sheet and the second metal sheet may each have a thick portion and a thin portion, or only one of the sheets may have a thick portion and a thin portion and the other sheet may have a constant thickness.

A sheet-shaped heat pipe according to a preferred embodiment of the present invention may have various functions in various combinations by combining the thicknesses and materials of the first metal sheet and the second metal sheet.

The working fluid sealed in the container of the sheet-shaped heat pipe according to a preferred embodiment of the present invention is not particularly limited as long as it is able to cause a gas-liquid phase change in an environment inside the container, and, for example, water, alcohol, or alternative chlorofluorocarbon may preferably be used. In a preferred embodiment of the present invention, the working fluid is an aqueous compound, and preferably, water.

The wick sealed in the container of a sheet-shaped heat pipe according to various preferred embodiments of the present invention is not particularly limited, and for example, may preferably have a structure to move the working fluid by capillary pressure. In this description, such a structure to move the working fluid by capillary pressure is referred to as a capillary structure, and includes a fine structure including irregularities, such as pores, grooves, or projections, for example, a porous structure, a fiber structure, a groove structure, or a mesh structure.

While the position of the wick is not particularly limited, the wick preferably continuously extends from an evaporation unit to a condensation unit inside the container. For example, when the container is shaped as a hollow rectangular or substantially rectangular parallelepiped, the wick may be provided on one inner wall surface or may be provided on all inner wall surfaces. The wick may be molded integrally with the container or may be obtained by working the inner wall surface of the container, or a separately provided wick may be attached to the inner wall surface of the container.

The capillary structure of the wick is not particularly limited, and may be a known structure used in conventional heat pipes and vapor chambers.

The wick may be an assembly of grooves, irregularities, or projections disposed at a predetermined interval on the inner wall surface of the container, or may be a sintered metal, a sintered ceramic material, or a fiber.

In a preferred embodiment of the present invention, the sheet-shaped heat pipe preferably includes a porous body disposed on the wick.

In a preferred embodiment of the present invention, the porous body may have an average pore diameter of about 100 nm or less, for example. The average pore diameter of the porous body is preferably within a range of about 0.3 nm to about 100 nm, more preferably within a range of about 0.3 nm to about 50 nm, and further preferably within a range of about 0.3 nm to about 20 nm, for example. As the average pore diameter decreases, the amount of working fluid retained by the porous body increases and the capillary pressure increases.

The average pore diameter of the porous body may be measured by a gas adsorption method. Specifically, gas is physically adsorbed on surfaces of pores and the pore distribution is measured from the relationship between the adsorption amount and the relative pressure. As the above-described gas, nitrogen is preferably used when the pore diameter is more than or equal to about 0.7 nm and argon is preferably used when the pore diameter is less than about 0.7 nm, for example.

In a preferred embodiment of the present invention, the porous body may have a specific surface area of about 100 $m^2/g$ or more. The specific surface area of the porous body may be preferably within a range of about 100 $m^2/g$ to about 20,000 $m^2/g$, more preferably within a range of about 500 $m^2/g$ to about 15,000 $m^2/g$, and further preferably within a range of about 1,000 $m^2/g$ to about 10,000 $m^2/g$, for example. As the specific surface area increases, the amount of working fluid that is able to be retained by the porous body increases.

The specific surface area of the porous body may be measured by the gas adsorption method. Specifically, gas is physically adsorbed on the surfaces of the pores, and the specific surface area can be converted from the relationship between the adsorption amount and the relative pressure, for example, according to a calculation formula of the BET method. As the gas, nitrogen is used when the pore diameter is more than or equal to about 0.7 nm and argon is used when the pore diameter is less than about 0.7 nm, for example.

In a preferred embodiment of the present invention, the porous body may have a working-fluid retaining ratio of about 5% or more by volume, preferably about 10% or more by volume, and more preferably about 20% or more by volume, for example. As the working-fluid retaining ratio increases, the amount of working fluid that is able to be retained by the porous body increases. By increasing the retaining ratio, the sheet-shaped heat pipe is able to achieve a larger heat transport amount.

The working-fluid retaining ratio refers to the ratio (% by volume) of the working fluid to be adsorbed on the porous body to the volume of the porous body. The weight change rate (reduction rate) is measured by thermogravimetry when the porous body is heated from about 40° C. to about 160° C., for example, and the retaining ratio is calculated from the weight change rate and the density of the porous body.

While the porous body is not particularly limited, it may preferably be, for example, zeolite or a porous metallic complex. Other examples of the porous body include mesoporous silica, a carbon-based material such as activated carbon, and diatomite.

Zeolite is not particularly limited as long as it has the pore diameter, specific surface area, or working-fluid retaining ratio described above, and may be appropriately selected according to desired performance. Typical examples of zeolites usable in preferred embodiments of the present invention include FAU type, LTA type, AFI type, MFI type, MOR type, AEL type, CHA type, BEA type, and LTL type zeolites according to the IZA Standard.

A porous metallic complex refers to a porous substance composed of metallic ions, organic ligands, and other components. The porous metallic complex is well known to those skilled in the art, and is also referred to as porous coordination polymers (PCP) or metal organic frameworks (MOF).

The porous metallic complex used in the present invention is not particularly limited as long as it has the pore diameter, specific surface area, or working-fluid retaining ratio described above, and may be appropriately selected according to desired performance. Typical examples of porous metallic complexes usable in preferred embodiments of the present invention include an MIL-based complex, a ZIF-based complex, an MOF-based complex, HKUST-1, and JAST-1.

The porous body is preferably hydrophilic. By using a hydrophilic porous body, when a hydrophilic working fluid, for example, water is used, the capillary pressure increases, and this increases the heat transport amount.

According to the type of the porous body, the desorption temperature of the working fluid differs. Therefore, the working temperature of the sheet-shaped heat pipe according to preferred embodiments of the present invention is able to be controlled by adjusting the type and amount of porous body disposed on the wick.

Since the porous body also absorbs and releases energy when absorbing and desorbing water, heat is more efficiently transported by utilizing this absorption and desorption energy.

In a preferred embodiment of the present invention, the sheet-shaped heat pipe is operated only by latent heat of the working fluid to transport heat at a low temperature, and is able to more efficiently transport heat by utilizing the absorption and desorption energy of the porous body in addition to the latent heat of the working fluid at a high temperature.

The method of disposing the porous body on the wick is not particularly limited. For example, a porous body film is formed by coating, or fine powder of the porous body is bound onto the wick. For example, when zeolite is used, it may be disposed on a wick by immersing the wick in a slurry containing zeolite and a low-melting-point glass and pulling up and heating the wick. When a porous metallic complex is used, it may be formed on a wick by immersing the wick in a solution containing metal ions and organic ligands serving as raw materials of the porous metallic complex and heating and drying the wick.

The thickness of the sheet-shaped heat pipe according to preferred embodiments of the present invention may be about 0.5 mm or less, and preferably within a range of about 0.05 mm to about 0.50 mm, for example. By setting the thickness of the sheet-shaped heat pipe to about 0.5 mm or less, the heat countermeasure member is able to be made thinner. By setting the thickness of the sheet-shaped heat pipe to about 0.05 mm or more, the strength of the sheet-shaped heat pipe is able to be more easily ensured. From the viewpoint of ensuring both thinning and strength, the thickness of the sheet-shaped heat pipe is more preferably within a range of about 0.15 mm to about 0.30 mm, for example.

Members other than the wick and the working fluid may be contained inside the container of the sheet-shaped heat pipe according to preferred embodiments of the present invention. For example, the container may include a support member that maintains a space in the container so that the space is not crushed, or a member that assists in movements of a working fluid in a gas phase and a working fluid in a liquid phase, such as an inner wall that separates moving spaces of the working fluids.

In a preferred embodiment of the present invention, the sheet-shaped heat pipe may preferably include a resin portion on the first metal sheet and/or the second metal sheet.

In a preferred embodiment of the present invention, the resin portion is preferably provided on only one of the first metal sheet and the second metal sheet.

In another preferred embodiment of the present invention, the resin portion is preferably provided on the first metal sheet and the second metal sheet.

The resin portion may be located at any positions on the first metal sheet and the second metal sheet, and may entirely cover the first metal sheet and the second metal sheet or may partially cover the first metal sheet and the second metal sheet. The resin portions on the first metal sheet and the second metal sheet may be located either at opposed positions or at unopposed positions.

While a resin material that is used for the resin portion is not particularly limited, examples of the resin include silicone resin, epoxy resin, an ethylene-vinyl acetate copolymer (EVA), chlorinated polyethylene (CPE), urethane resin, and polyimide resin.

In a preferred embodiment of the present invention, the resin portion may preferably include other materials. When the resin portion includes other materials, various functions are able to be provided to the sheet-shaped heat pipes of preferred embodiments of the present invention.

Examples of other materials include an electromagnetic-wave absorbing material (for example, a magnetic filler) and a heat storage material (for example, a paraffin filler or vanadium oxide). By using the electromagnetic-wave absorbing material, the sheet-shaped heat pipe obtains a function of shielding electromagnetic-wave noise. By using the heat storage material, the rise in temperature of the heating element is delayed.

In a preferred embodiment of the present invention, a thermal conductivity of the resin portion is preferably lower than a thermal conductivity of the first metal sheet or the second metal sheet including the resin portion. By making the thermal conductivity of the resin portion lower than the thermal conductivity of the metal sheet, the soaking effect in the planar direction of the metal sheet including the resin portion is improved.

In a preferred embodiment of the present invention, an elastic modulus of the resin portion is preferably lower than an elastic modulus of the first metal sheet or the second metal sheet including the resin portion. By making the elastic modulus of the resin portion lower than the elastic modulus of the metal sheet, the stress applied to the sheet-shaped heat pipe is relaxed, and breakage is prevented.

A thickness of the resin portion may preferably be about 0.5 mm or less, more preferably within a range of about 0.05 mm to about 0.50 mm, and further preferably within a range of about 0.15 mm to about 0.30 mm, for example.

The resin portion may be set by applying resin on a surface of the metal sheet, or a separately produced resin sheet may be attached. Alternatively, a metal sheet on which a resin portion is provided beforehand may be used A production method for the sheet-shaped heat pipes according to preferred embodiments of the present invention is not particularly limited as long as the method is able to obtain the above-described structures. For example, the sheet-shaped heat pipe may be obtained by superposing and bonding two metal sheets to provide an opening through which a wick and a working fluid are sealed, disposing the wick and the working fluid into the container through the opening, and then sealing the opening. Alternatively, the sheet-shaped heat pipe may be obtained by disposing a wick on one metal sheet, superposing the other metal sheet thereon, partially bonding the metal sheets, disposing a working fluid through an opening, and sealing the opening.

The wick may be formed on the metal sheets beforehand. While the bonding method for the first metal sheet and the second metal sheet is not particularly limited, for example, resistance welding, laser welding, ultrasonic bonding, and bonding using a brazing material including solder may preferably be used.

As described above, the sheet-shaped heat pipes according to preferred embodiments of the present invention can have various functions according to combinations of the thickness, material, and resin part of the first metal sheet and the second metal sheet that constitute the container. For example, according to preferred embodiments of the sheet-shaped heat pipe, the following sheet-shaped heat pipes are provided.

First Preferred Embodiment

Figure 1:
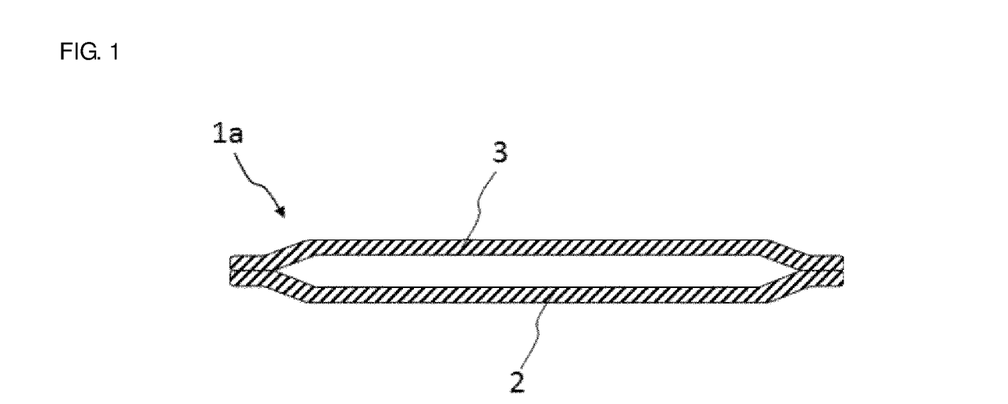
FIG. 1 is a schematic sectional view of a sheet-shaped heat pipe 1a according to a preferred embodiment of the present invention.

A sheet-shaped heat pipe $1a$ according to a first preferred embodiment of the present invention as shown in FIG. 1 includes a first metal sheet 2 and a second metal sheet 3 having the same or substantially the same thickness. The sheet-shaped heat pipe $1a$ of the first preferred embodiment is not distinguished between an upper side and a lower side, and is easily set in, for example, an electronic component.

Second Preferred Embodiment

Figure 2:
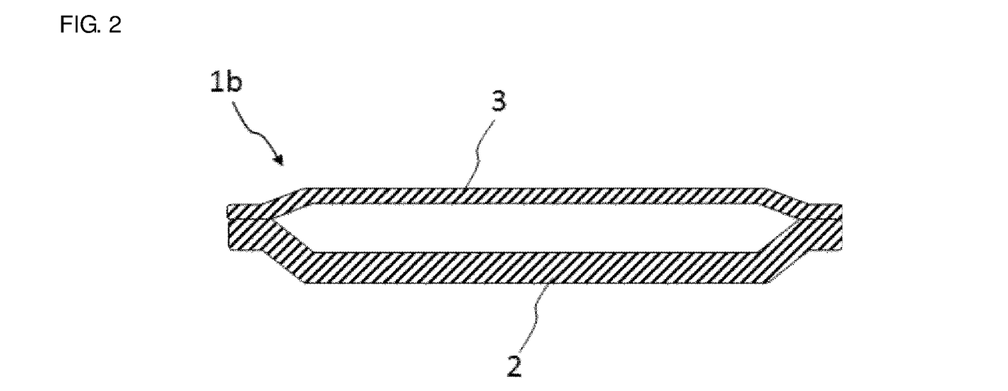
FIG. 2 is a schematic sectional view of a sheet-shaped heat pipe 1b according to another preferred embodiment of the present invention.

In a sheet-shaped heat pipe $1b$ according to a second preferred embodiment of the present invention, the thickness of one metal sheet (a first metal sheet 2 in FIG. 2) is larger than the thickness of the other metal sheet (a second metal sheet 3 in FIG. 2). In the sheet-shaped heat pipe $1b$ of the second preferred embodiment, for example, the thicker metal sheet provides a higher strength, a higher rigidity, a higher noise removing function, and a higher electromagnetic shield function.

Third Preferred Embodiment

Figure 3:
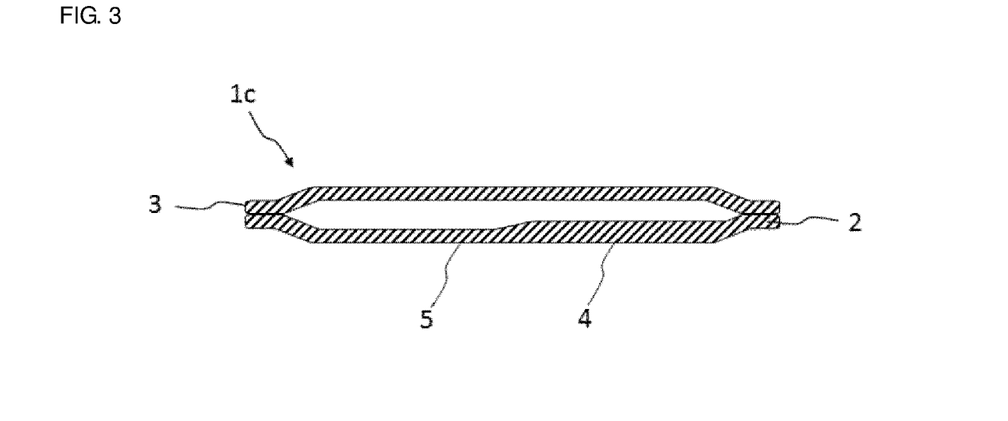
FIG. 3 is a schematic sectional view of a sheet-shaped heat pipe 1c according to another preferred embodiment of the present invention.

In a sheet-shaped heat pipe $1c$ according to a third preferred embodiment of the present invention, one metal sheet (a first metal sheet 2 in FIG. 3) has a thick portion 4 and a thin portion 5 and the other metal sheet (a second metal sheet 3 in FIG. 3) has a constant thickness. In the sheet-shaped heat pipe $1c$ of the third preferred embodiment, for example, a higher electromagnetic shield function is obtained by the thick portion of the metal sheet and heat is more efficiently exchanged between the inside of the container and the outside of the container by the thin portion.

Fourth Preferred Embodiment

Figure 4:
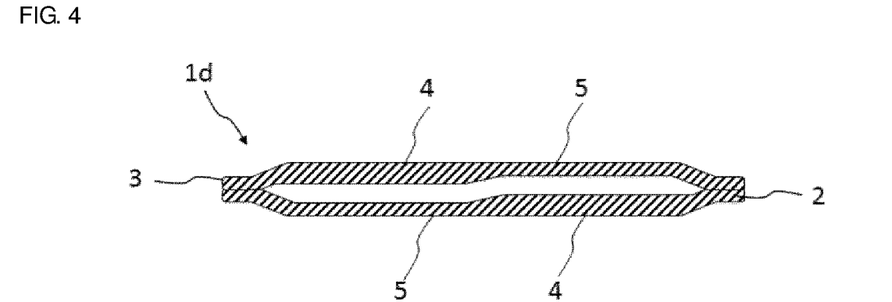
FIG. 4 is a schematic sectional view of a sheet-shaped heat pipe 1d according to another preferred embodiment of the present invention.

In a sheet-shaped heat pipe $1d$ according to a fourth preferred embodiment of the present invention as shown in FIG. 4, a first metal sheet 2 and a second metal sheet 3 include respective thick portions 4 and thin portions 5, and the thick portion and the thin portion of one of the metal sheets are respectively opposed to the thin portion and the thick portion of the other metal sheet. In the sheet-shaped heat pipe $1d$ of the fourth preferred embodiment, for example, a higher electromagnetic shield function is obtained by the thick portions of the metal sheets, and heat is more efficiently exchanged between the inside of the container and the outside of the container by the thin portions. Moreover, these functions are provided to both surfaces of the heat pipe.

Fifth Preferred Embodiment

Figure 5:
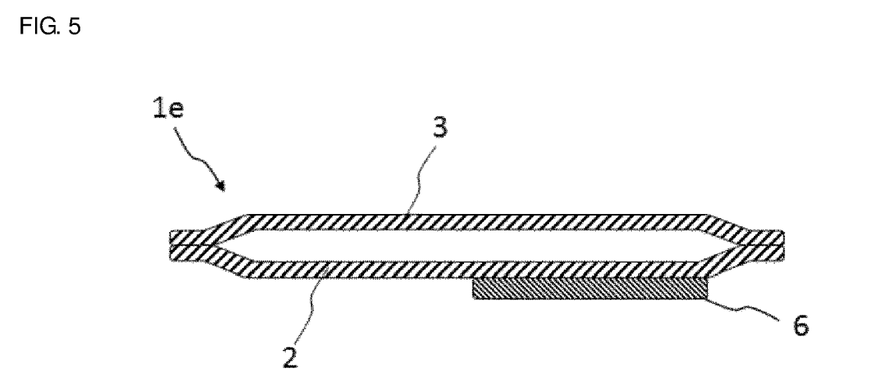
FIG. 5 is a schematic sectional view of a sheet-shaped heat pipe 1e according to another preferred embodiment of the present invention.

In a sheet-shaped heat pipe $1e$ according to a fifth preferred embodiment of the present invention, one metal sheet (a first metal sheet 2 in FIG. 5) includes a resin portion 6. The sheet-shaped heat pipe $1e$ of the fifth preferred embodiment is able to have various functions due to the resin portion being provided on the metal sheet.

Sixth Preferred Embodiment

Figure 6:
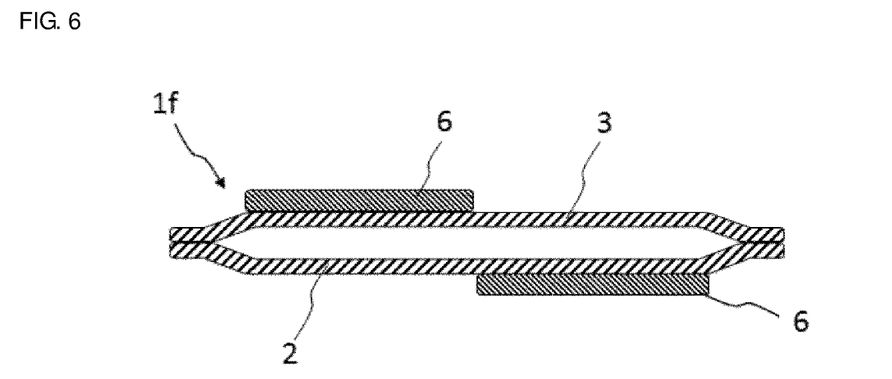
FIG. 6 is a schematic sectional view of a sheet-shaped heat pipe 1f according to another preferred embodiment of the present invention.

In a sheet-shaped heat pipe $1f$ according to a sixth preferred embodiment of the present invention as shown in FIG. 6, a first metal sheet 2 and a second metal sheet 3 include respective resin portions 6 and the resin portions 6 are not opposed to each other. The sheet-shaped heat pipe $1f$ of the sixth preferred embodiment is able to have various functions because it includes a plurality of resin portions.

In FIGS. 1 to 6, for simplicity, a wick and a working fluid are not illustrated.

Next, thin heat dissipating plates according to preferred embodiments of the present invention will be described.

A thin heat dissipating plate according to a preferred embodiment of the present invention includes a metal plate and the above-described sheet-shaped heat pipe disposed on the metal plate such that the metal plate and a principal surface of the second metal sheet are in direct contact with each other.

The material of the metal plate is not particularly limited as long as it is metal, and may be, for example, copper, an Al alloy, a Mg alloy, and titanium.

The thickness of the metal plate may be about 1.0 mm or less, and preferably within a range of about 0.10 mm to about 1.0 mm, for example. By setting the thickness of the thin heat dissipating plate at about 1.0 mm or less, the heat countermeasure member is able to be thinned. By setting the thickness of the thin heat dissipating plate at about 0.10 mm or more, the strength of the thin heat dissipating plate is able to be ensured more easily. From the viewpoint of achieving both a smaller thickness and a higher strength, the thickness of the thin heat dissipating plate is more preferably within a range of about 0.30 mm to about 0.80 mm, for example.

In a preferred embodiment of the present invention, the metal plate may preferably include a recess in which the sheet-shaped heat pipe is disposed. The depth of the recess is appropriately set according to the thickness of the sheet-shaped heat pipe to be set therein, and may be, for example, about 0.5 mm or less, preferably within a range of about 0.05 mm to about 0.50 mm, and more preferably within a range of about 0.15 mm to about 0.30 mm.

In the thin heat dissipating plate according to preferred embodiments of the present invention, the above-described sheet-shaped heat pipe is disposed on the metal plate such that the metal plate and a principal surface of the second metal sheet are in direct contact with each other.

In a preferred embodiment of the present invention, the metal plate preferably has a recess and the sheet-shaped heat pipe is provided in the recess. By setting the sheet-shaped heat pipe in the recess, the thickness is prevented from being significantly increased by the sheet-shaped heat pipe. Preferably, the depth of the recess is less than or equal to the thickness of the sheet-shaped heat pipe, for example, less than the thickness of the sheet-shaped heat pipe or equal to the thickness of the sheet-shaped heat pipe.

A method for setting the metal plate and the sheet-shaped heat pipe is not particularly limited. A sheet-shaped heat pipe produced beforehand may be provided on the metal plate, or a sheet-shaped heat pipe may be produced and provided directly on the metal plate.

When the sheet-shaped heat pipe produced beforehand is provided, for example, it is preferably bonded with solder, a conductive adhesive, or a thermal conductive tape or is mechanically fixed by using screw holes or claws.

When the sheet-shaped heat pipe is directly produced on the metal plate, for example, it can be produced by the following non-limiting exemplary method. First, a second metal sheet is disposed or formed on a metal plate, a wick is then disposed or formed, a first metal sheet is provided thereon, the first metal sheet and the second metal sheet are bonded except for a sealing port of a working fluid, and the sealing port is closed and sealed after the working fluid is sealed therein. By directly producing the sheet-shaped heat pipe on the metal plate, the metal plate and the second metal sheet are combined, and the sheet-shaped heat pipe and the metal plate are easily brought into closer contact with each other. As a result, the efficiency in exchanging heat between the sheet-shaped heat pipe and the heat dissipating plate is improved, and the space in the recess of the heat dissipating plate is effectively utilized. Thus, the capacity of the container is further increased.

In a preferred embodiment of the present invention, a container may preferably be defined by a metal plate and a first metal sheet by directly disposing a wick on the metal plate without disposing a second metal sheet thereon, and then bonding the metal plate and the first metal sheet. That is, in this preferred embodiment, the metal plate also functions as the second metal sheet. In this preferred embodiment, the capacity of the container is further increased.

A thin heat dissipating plate according to a preferred embodiment of the present invention includes a metal plate, and a sheet-shaped heat pipe disposed on the metal plate, wherein the sheet-shaped heat pipe includes a sheet-shaped container, a wick sealed in the container, and a working fluid sealed in the container, the sheet-shaped container includes a first metal sheet and a second metal sheet, the first metal sheet and the second metal sheet are superposed and partially bonded to provide a closed internal space, and the second metal sheet is combined with the metal plate or the metal plate also functions as the second metal sheet.

The heat dissipating plates according to preferred embodiments of the present invention may have various functions by appropriating selecting the specific structure of the above-described sheet-shaped heat pipe. For example, the following heat dissipating plates are described as preferred embodiments of the heat dissipating plates of the present invention.

Seventh Preferred Embodiment

Figure 7:
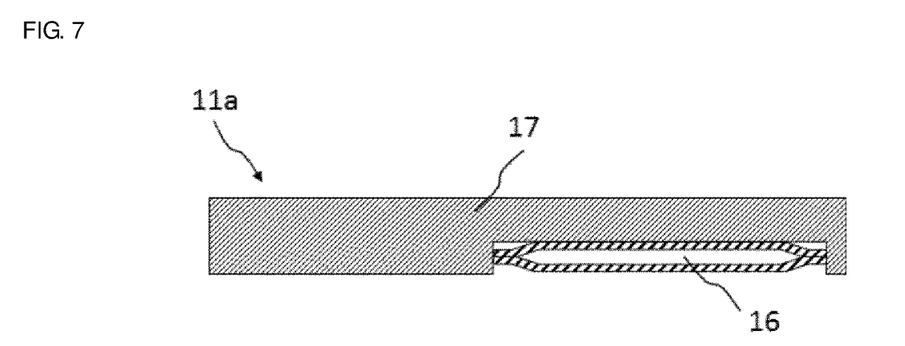
FIG. 7 is a schematic sectional view of a thin heat dissipating plate 11a according to a preferred embodiment of the present invention.

A heat dissipating plate $11a$ according to a seventh preferred embodiment of the present invention as shown in FIG. 7 includes a sheet-shaped heat pipe 16 produced beforehand is disposed in a recess of a metal plate 17. For example, the heat dissipating plate of the seventh preferred embodiment has a high degree of design flexibility in design and production method of the sheet-shaped heat pipe because the sheet-shaped heat pipe is separately produced.

Eighth Preferred Embodiment

Figure 8:
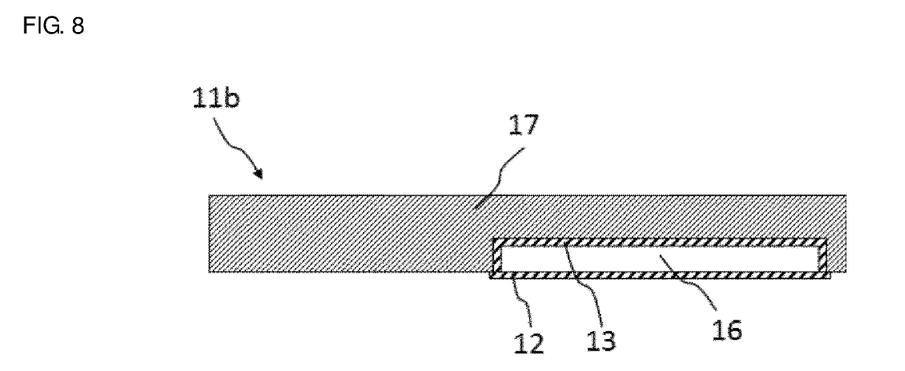
FIG. 8 is a schematic sectional view of a thin heat dissipating plate 11b according to another preferred embodiment of the present invention.

A heat dissipating plate $11b$ according to an eighth preferred embodiment of the present invention as shown in FIG. 8 includes a metal plate 17 and a second metal sheet 13 that are combined with each other. Since the second metal sheet 13 of the sheet-shaped heat pipe is in direct contact with the metal plate, for example, the heat dissipating plate of the eighth preferred embodiment has a high efficiency in exchanging heat between the sheet-shaped heat pipe and the metal plate, and is able to increase the capacity of the container.

Ninth Preferred Embodiment

Figure 9:
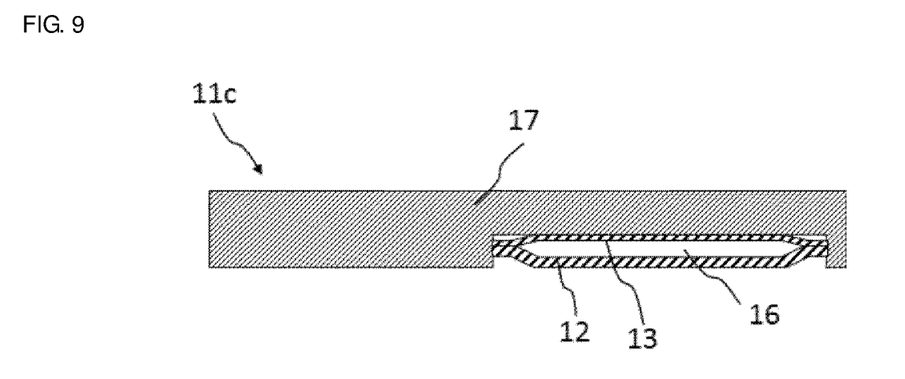
FIG. 9 is a schematic sectional view of a thin heat dissipating plate 11c according to another preferred embodiment of the present invention.

A heat dissipating plate $11c$ according to a ninth preferred embodiment of the present invention as shown in FIG. 9 includes a first metal sheet 12 that is thick and a second metal sheet 13 that is thin. For example, the heat dissipating plate of the ninth preferred embodiment has higher strength and rigidity, especially, higher rigidity, and obtains a higher noise removing function and a higher electromagnetic shield function because the thick metal sheet is located on the surface of the heat dissipating plate. Further, since the second metal sheet that separates the metal plate and the inside of the container is thin, for example, the heat dissipating plate efficiently is able to exchange heat between the metal plate and the inside of the container.

Tenth Preferred Embodiment

Figure 10:
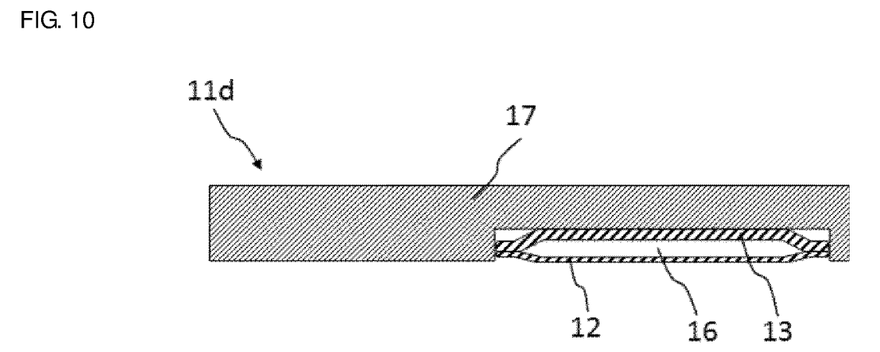
FIG. 10 is a schematic sectional view of a thin heat dissipating plate 11d according to another preferred embodiment of the present invention.

A heat dissipating plate $11d$ according to a tenth preferred embodiment of the present invention as shown in FIG. 10 includes a second metal sheet 13 that is thick and a first metal sheet 12 that is thin. For example, the heat dissipating plate of the tenth preferred embodiment efficiently receives heat from the outside, especially, from a heating unit because the first metal sheet 12 arranged as an exposed surface of the sheet-shaped heat pipe is thin. Also, the heat dissipating plate also ensures strength because the second metal sheet 13 is thick.

Eleventh Preferred Embodiment

Figure 11:
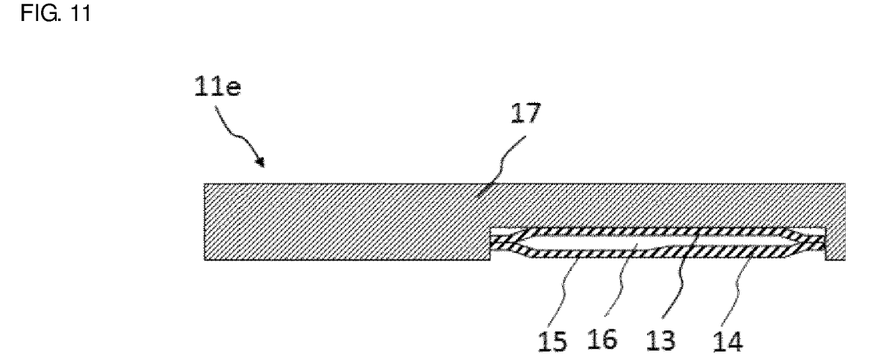
FIG. 11 is a schematic sectional view of a thin heat dissipating plate 11e according to another preferred embodiment of the present invention.

A heat dissipating plate $11e$ according to a eleventh preferred embodiment of the present invention as shown in FIG. 11 includes a first metal sheet 12 that includes a thick portion 14 and a thin portion 15 and a second metal sheet 13 that has a constant thickness. For example, the heat dissipating plate of the eleventh preferred embodiment obtains a higher electromagnetic shield function by the thick portion of the first metal sheet 12 and efficiently receives heat from the outside, especially, from a heating unit by the thin portion.

Twelfth Preferred Embodiment

Figure 12:
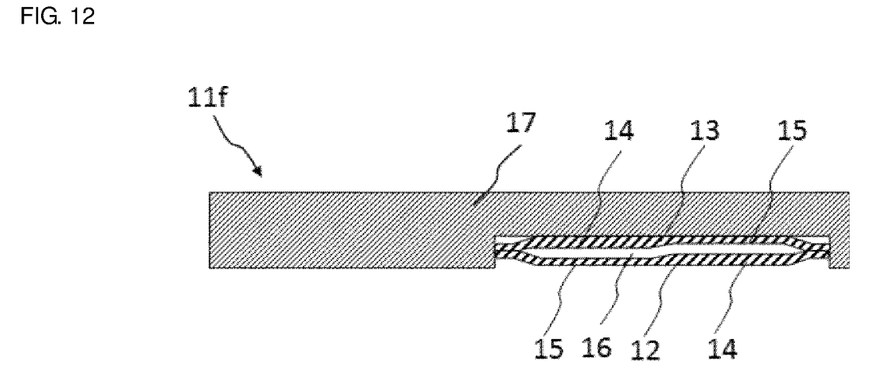
FIG. 12 is a schematic sectional view of a thin heat dissipating plate 11f according to another preferred embodiment of the present invention.

A heat dissipating plate $11f$ according to a twelfth preferred embodiment of the present invention as shown in FIG. 12 includes a first metal sheet 12 and a second metal sheet 13 that include respective thick portions 14 and thin portions 15 and the thick portion and the thin portion of one of the metal sheets are respectively opposed to the thin portion and the thick portion of the other metal sheet. For example, the heat dissipating plate of the twelfth preferred embodiment obtains a higher electromagnetic shield function by the thick portions of the metal sheets, efficiently receives heat from a heating unit by the thin portions, and more efficiently exchanges heat between the inside of the container and the metal plate.

Thirteenth Preferred Embodiment

Figure 13:
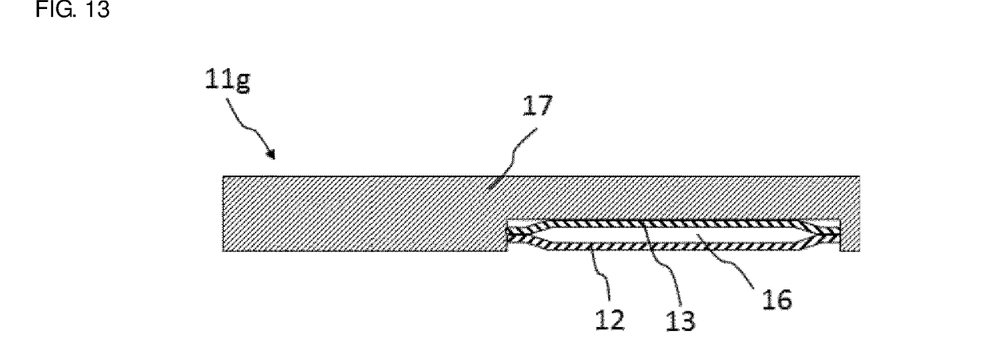
FIG. 13 is a schematic sectional view of a thin heat dissipating plate 11g according to another preferred embodiment of the present invention.

In a heat dissipating plate $11g$ according to a thirteenth preferred embodiment of the present invention as shown in FIG. 13, the material of a first metal sheet 12 and the material of a second metal sheet 13 are different from each other. For example, the heat dissipating plate of the thirteenth preferred embodiment is able to provide various functions, such as a strength increasing function, a rigidity increasing function, a heat conducting function, and an electromagnetic shield function, because the material of the first metal sheet 12 and the material of the second metal sheet 13 are different from each other.

Fourteenth Preferred Embodiment

In a heat dissipating plate 11h according to an fourteenth preferred embodiment of the present invention, the thermal conductivity of a first metal sheet 12 is higher than the thermal conductivity of a second metal sheet 13. For example, the heat dissipating plate of the fourteenth preferred embodiment efficiently receives heat from the outside, especially, from a heating unit, and therefore, increases the heat receiving efficiency without changing the thickness because the thermal conductivity of the first metal sheet 12 is high.

Fifteenth Preferred Embodiment

In a heat dissipating plate 11i according to a fifteenth preferred embodiment of the present invention, the hardness of a first metal sheet 12 is higher than the hardness of a second metal sheet 13. For example, the heat dissipating plate of the fifteenth preferred embodiment increases the rigidity without increasing the thickness because the hardness of the first metal sheet 12 is high.

Sixteenth Preferred Embodiment

In a heat dissipating plate 11j according to a sixteenth preferred embodiment of the present invention, the hardness of a second metal sheet 13 is higher than the hardness of a first metal sheet 12. For example, the heat dissipating plate of the sixteenth preferred embodiment increases the strength without increasing the thickness because the hardness of the second metal sheet 13 is high.

Seventeenth Preferred Embodiment

Figure 14:
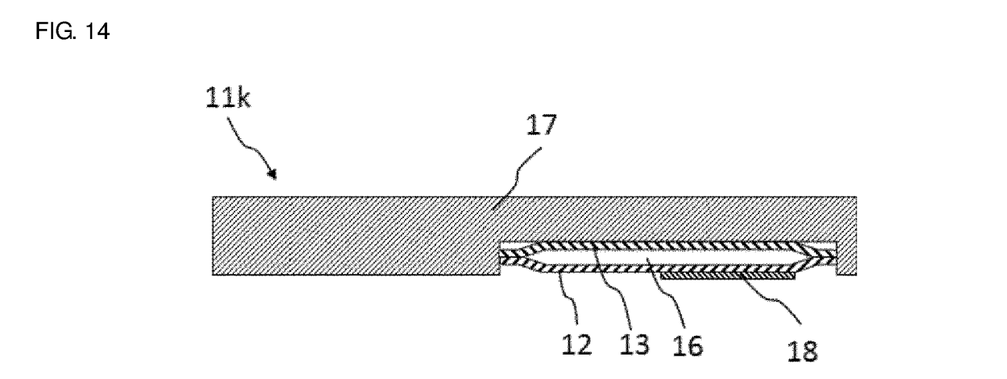
FIG. 14 is a schematic sectional view of a thin heat dissipating plate 11k according to another preferred embodiment of the present invention.

In a heat dissipating plate 11k according to an seventeenth preferred embodiment of the present invention as shown in FIG. 14, a resin portion is provided on a first metal sheet 12. The heat dissipating plate of the seventeenth preferred embodiment is able to provide various functions due to the resin portion.

Eighteenth Preferred Embodiment

Figure 15:
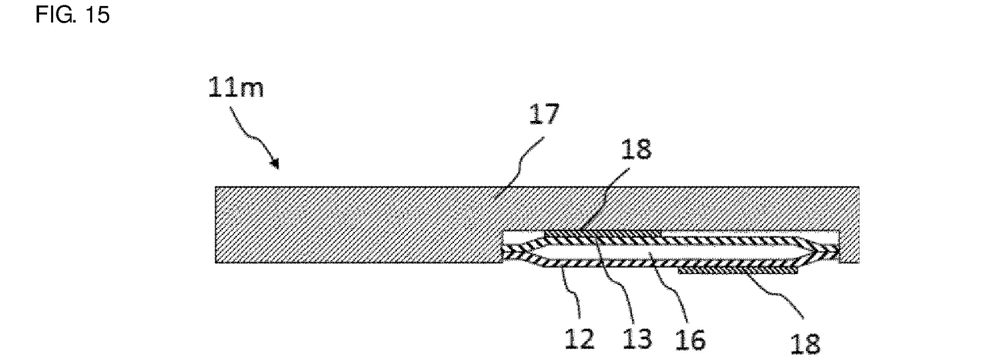
FIG. 15 is a schematic sectional view of a thin heat dissipating plate 11m according to another preferred embodiment of the present invention.

In a heat dissipating plate 11m according to a eighteenth preferred embodiment of the present invention as shown in FIG. 15, a resin portion is provided on a first metal sheet 12 and a resin portion is provided on a second metal sheet 13, and these resin portions are not opposed to each other. The heat dissipating plate of the eighteenth preferred embodiment is able to have various functions due to the resin portions.

Nineteenth Preferred Embodiment

In a heat dissipating plate 11n according to a nineteenth preferred embodiment of the present invention, each resin portion in the seventeenth and eighteenth preferred embodiments preferably includes an electromagnetic-wave absorbing material and/or a heat storage material. The heat dissipating plate of the nineteenth preferred embodiment has an electromagnetic-wave absorbing function or a heat storage function due to the electromagnetic-wave absorbing material or the heat storage material contained in the resin portion.

Twentieth Preferred Embodiment

A heat dissipating plate 11p according to a twentieth preferred embodiment of the present invention, the thermal conductivity of each resin portion in the seventeenth and eighteenth preferred embodiments is preferably lower than the thermal conductivity of the first metal sheet 12 and the second metal sheet 13.

Twenty-First Preferred Embodiment

A heat dissipating plate 11q according to a twenty-first preferred embodiment of the present invention, the elastic modulus of each resin portion in the seventeenth and eighteenth preferred embodiments is preferably lower than the elastic modulus of the first metal sheet 12 and the second metal sheet 13.

In FIGS. 7 to 15, for simplicity, a wick and a working fluid are not illustrated.

Since the sheet-shaped heat pipes and the thin heat dissipating plates according to preferred embodiments of the present invention are thin, they are suitably used in electronic devices that are required to have a small size, especially, a small thickness, for example, mobile terminals such as smartphones and tablets.

Therefore, preferred embodiments of the present invention also provide electronic devices including a sheet-shaped heat pipes or a thin heat dissipating plates according to preferred embodiments of the invention.

When a heat dissipating plate according to a preferred embodiment of the present invention is provided in an electronic device, it is normally arranged such that a portion of the sheet-shaped heat pipe is in direct or indirect contact with a heating element or under the influence of heat from the heating element.

Figure 16:
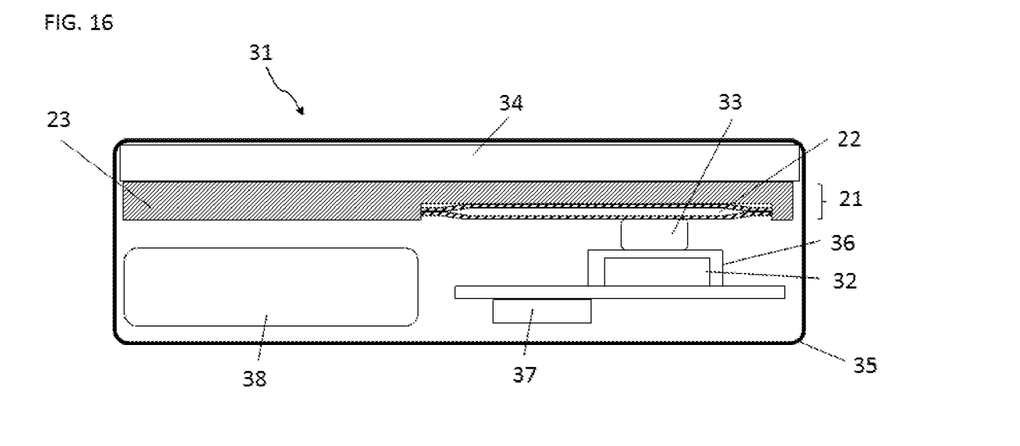
FIG. 16 schematically illustrates a setting example of the heat dissipating plate of a preferred embodiment of the present invention in an electronic component.
Figure 17:
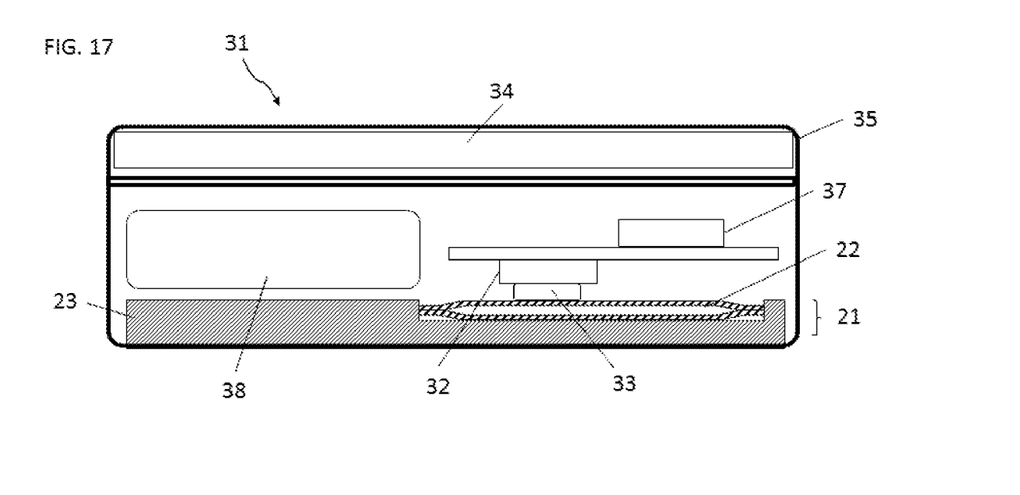
FIG. 17 schematically illustrates another setting example of the heat dissipating plate of a preferred embodiment of the present invention in an electronic component.

FIGS. 16 and 17 illustrate examples of assemblies in an electronic device.

Referring to FIG. 16, a heat dissipating plate 21 according to a preferred embodiment of the present invention is arranged such that a sheet-shaped heat pipe 22 is thermally coupled to a heating component 32 inside an electronic device 31 through a thermal interface material 33 and a metal plate 23 transfers heat to a liquid crystal display 34. In this case, heat generated in the heating component 32 is transmitted to the sheet-shaped heat pipe 22 through the thermal interface material 33, and is transferred over a wide range of the metal plate 23 by the sheet-shaped heat pipe 22. The heat transferred to the metal plate is further dissipated to the outside through the liquid crystal display 34.

Referring to FIG. 17, a heat dissipating plate 21 according to a preferred embodiment of the present invention is arranged such that a sheet-shaped heat pipe 22 is thermally coupled to a heating component 32 inside an electronic device 31 through a thermal interface material 33 and a metal plate 23 is disposed in contact with a housing 35. In this case, heat generated in the heating component 32 is transmitted to the sheet-shaped heat pipe 22 through the thermal interface material 33, and is transferred over a wide range of the metal plate 23 by the sheet-shaped heat pipe 22. The heat transferred to the metal plate is further dissipated to the outside through the housing 35.

The sheet-shaped heat pipes and the thin heat dissipating plates according to preferred embodiments of the present invention are also able to function as a shield while being electrically coupled to a ground of a circuit in an electric device.

Since the sheet-shaped heat pipes and the thin heat dissipating plates according to preferred embodiments of the present invention are thin, they are able to be used for a wide range of applications. In particular, the sheet-shaped heat pipes and the thin heat dissipating plates may preferably be used, for example, as a cooling device for a small electronic device, for applications requiring a small size and efficient heat transport.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A sheet-shaped heat pipe comprising:
a sheet-shaped container;
a wick sealed in the container; and
a working fluid sealed in the container; wherein
the sheet-shaped container includes a first metal sheet and a second metal sheet; the first metal sheet and the second metal sheet are superposed and at least partially bonded to provide a closed internal space therebetween;
a thickness of the sheet-shaped container is about 0.5 mm or less; a material of the first metal sheet and a material of the second metal sheet are different from each other; and
the first metal sheet includes a first thick portion and a first thin portion, and the second metal sheet includes a second thick portion and a second thin portion, the first thick portion is positioned opposing the second thin portion and the first thin portion is positioned opposing the second thick portion.

2. The sheet-shaped heat pipe according to claim 1, wherein a resin portion is provided on at least one of the first metal sheet and the second metal sheet.

3. The sheet-shaped heat pipe according to claim 2, wherein the resin portion includes at least one of an electromagnetic-wave absorbing material and a heat storage material.

4. The sheet-shaped heat pipe according to claim 2, wherein a thermal conductivity of the resin portion is lower than a thermal conductivity of at least one of the first metal sheet and the second metal sheet.

5. The sheet-shaped heat pipe according to claim 2, wherein an elastic modulus of the resin portion is lower than an elastic modulus of at least one of the first metal sheet and the second metal sheet.

6. The sheet-shaped heat pipe according to claim 1, wherein a porous body having an average pore diameter of about 100 nm or less is disposed on a surface of the wick.

7. The sheet-shaped heat pipe according to claim 6, wherein the porous body includes zeolite or a porous metallic complex.

8. The sheet-shaped heat pipe according to claim 1, wherein a porous body having a specific surface area of about 100 m$^2$/g or more is disposed on a surface of the wick.

9. The sheet-shaped heat pipe according to claim 1, wherein a porous body having a retaining ratio of the working fluid of about 5% or more by volume is disposed on a surface of the wick.

10. A heat dissipating plate comprising:
a metal plate; and
the sheet-shaped heat pipe according to claim 1; wherein
the sheet-shaped heat pipe is disposed on the metal plate such that the metal plate and a principal surface of the second metal sheet are in direct contact with each other.

11. The heat dissipating plate according to claim 10, wherein the metal plate includes a recess and the sheet-shaped heat pipe is disposed in the recess.

12. The heat dissipating plate according to claim 10, wherein a thermal conductivity of the first metal sheet is higher than a thermal conductivity of the second metal sheet.

13. The heat dissipating plate according to claim 10, wherein a hardness of the first metal sheet is higher than a hardness of the second metal sheet.

14. The heat dissipating plate according to claim 10, wherein a hardness of the second metal sheet is higher than a hardness of the first metal sheet.

15. The heat dissipating plate according to claim 10, wherein a resin portion is provided on one of the first metal sheet and the second metal sheet.

16. The heat dissipating plate according to claim 15, wherein the resin portion includes at least one of an electromagnetic-wave absorbing material and a heat storage material.

17. The heat dissipating plate according to claim 15, wherein a thermal conductivity of the resin portion is lower than a thermal conductivity of at least one of the first metal sheet and the second metal sheet.

18. The heat dissipating plate according to claim 15, wherein an elastic modulus of the resin portion is lower than an elastic modulus of at least one of the first metal sheet and the second metal sheet.

19. The heat dissipating plate according to claim 15, wherein the resin portion is disposed only on the first metal sheet.

20. The heat dissipating plate according to claim 10, wherein the heat dissipating plate has a thickness of about 1.0 mm or less.

21. A heat dissipating plate comprising:
a metal plate; and
a sheet-shaped heat pipe disposed on the metal plate; wherein
the sheet-shaped heat pipe includes:
a sheet-shaped container;
a wick sealed in the container; and
a working fluid sealed in the container;
the sheet-shaped container includes a first metal sheet and a second metal sheet;
the first metal sheet and the second metal sheet are superposed and at least partially bonded to provide a closed internal space therebetween;
the second metal sheet is combined with the metal plate;
a material of the first metal sheet and a material of the second metal sheet are different from each other; and
the first metal sheet includes a first thick portion and a first thin portion, and the second metal sheet includes a second thick portion and a second thin portion, the first thick portion is positioned opposing the second thin portion and the first thin portion is positioned opposing the second thick portion.

22. An electronic device comprising the sheet-shaped heat pipe according to claim 1.

23. The electronic device according to claim 22, wherein the sheet-shaped heat pipe is electrically coupled to a ground of a circuit to function as a shield.

24. An electronic device comprising the heat dissipating plate according to claim 10.

25. The electronic device according to claim 24, wherein the heat dissipating plate is electrically coupled to a ground of a circuit to function as a shield.

26. A heat dissipating plate comprising:
a metal plate; and
a sheet-shaped heat pipe disposed on the metal plate; wherein
the sheet-shaped heat pipe includes:
 a sheet-shaped container;
 a wick sealed in the container; and
 a working fluid sealed in the container;
the sheet-shaped container includes a first metal sheet and a second metal sheet;
the first metal sheet and the second metal sheet are superposed and at least partially bonded to provide a closed internal space therebetween;
the metal plate also defines the second metal sheet;
a material of the first metal sheet and a material of the second metal sheet are different from each other; and
the first metal sheet includes a first thick portion and a first thin portion, and the second metal sheet includes a second thick portion and a second thin portion, the first thick portion is positioned opposing the second thin portion and the first thin portion is positioned opposing the second thick portion.

* * * * *